United States Patent
Hsueh et al.

(10) Patent No.: US 9,341,940 B2
(45) Date of Patent: May 17, 2016

(54) RETICLE AND METHOD OF FABRICATING THE SAME

(71) Applicant: TAIWAN SEMICONDUCTOR MANUFACTURING CO., LTD., Hsinchu (TW)

(72) Inventors: Wen-Chang Hsueh, Longtan Township (TW); Chia-Jen Chen, Jhudong Township (TW); Ta-Cheng Lien, Cyonglin Township (TW); Hsin-Chang Lee, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 55 days.

(21) Appl. No.: 14/278,678

(22) Filed: May 15, 2014

(65) Prior Publication Data

US 2015/0331309 A1    Nov. 19, 2015

(51) Int. Cl.
*G03F 1/32* (2012.01)

(52) U.S. Cl.
CPC ........................................ *G03F 1/32* (2013.01)

(58) Field of Classification Search
CPC ........... G03F 1/0076; G03F 1/08; G03F 1/28; G03F 1/32

USPC .............................................................. 430/5
See application file for complete search history.

(56) References Cited

U.S. PATENT DOCUMENTS

| 8,431,291 B2 * | 4/2013 | Liu | ........................... | G03F 1/00 430/312 |
| 8,673,520 B2 * | 3/2014 | Liu | ........................... | G03F 1/00 430/5 |
| 2011/0217630 A1 | 9/2011 | Liu et al. | | |

FOREIGN PATENT DOCUMENTS

| TW | 201104351 A | 2/2011 |
| TW | 201115264 A | 5/2011 |

* cited by examiner

*Primary Examiner* — Christopher Young
(74) *Attorney, Agent, or Firm* — Maschoff Brennan

(57) ABSTRACT

A reticle and a method of fabricating the reticle are provided. In various embodiments, the reticle includes a substrate, a patterned first attenuating layer, a patterned second attenuating layer, and a patterned third attenuating layer. The patterned first attenuating layer is disposed on the substrate. The patterned second attenuating layer is disposed on the patterned first attenuating layer. The patterned third attenuating layer is disposed on the patterned second attenuating layer. A first part of the patterned first attenuating layer, a first part of patterned second attenuating layer, and the patterned third attenuating layer are stacked on the substrate as a binary intensity mask portion.

20 Claims, 9 Drawing Sheets

RETICLE AND METHOD OF FABRICATING THE SAME

BACKGROUND

Among integrated circuit (IC) fabrication techniques, lithography process is an important technique used in forming selected circuit patterns on a substrate such as a semiconductor wafer. As integration density of IC is increasing in fabricating smaller and more complex circuits of semiconductor devices, advanced lithography techniques are accordingly required in producing smaller critical dimensions (CDs) and fine patterns.

In advanced lithography techniques, different reticles (also referred to as masks or photomasks) are utilized for various requirements of the lithography process. For example, binary intensity masks (BIMs) have good performance and are cost effective because of its simplest structure with transparent portions and totally opaque portions. In addition, phase-shift masks (PSMs) have relatively opaque portions and have been used to overcome problems associated with light diffraction and to enhance the lithography exposure resolution. Besides, chromeless phase-shift masks (CPMs) do not have opaque portions and reduce diffraction effects by combining both phase-shifted light and non-phase-shifted light so that constructive and destructive interference takes place, and therefore improve resolution and depth of focus of a projected image of an optical system. Therefore, each kind of the reticles has its own structure and advantage in different scopes of application.

Because requirement in lithography processes keeps increasing, forming smaller CDs and fine patterns becomes even challenging. Therefore, reticles utilized in lithography processes have to become more delicate to overcome various difficulties in different scopes of application. As such, improvements in reticles and methods of fabricating thereof continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
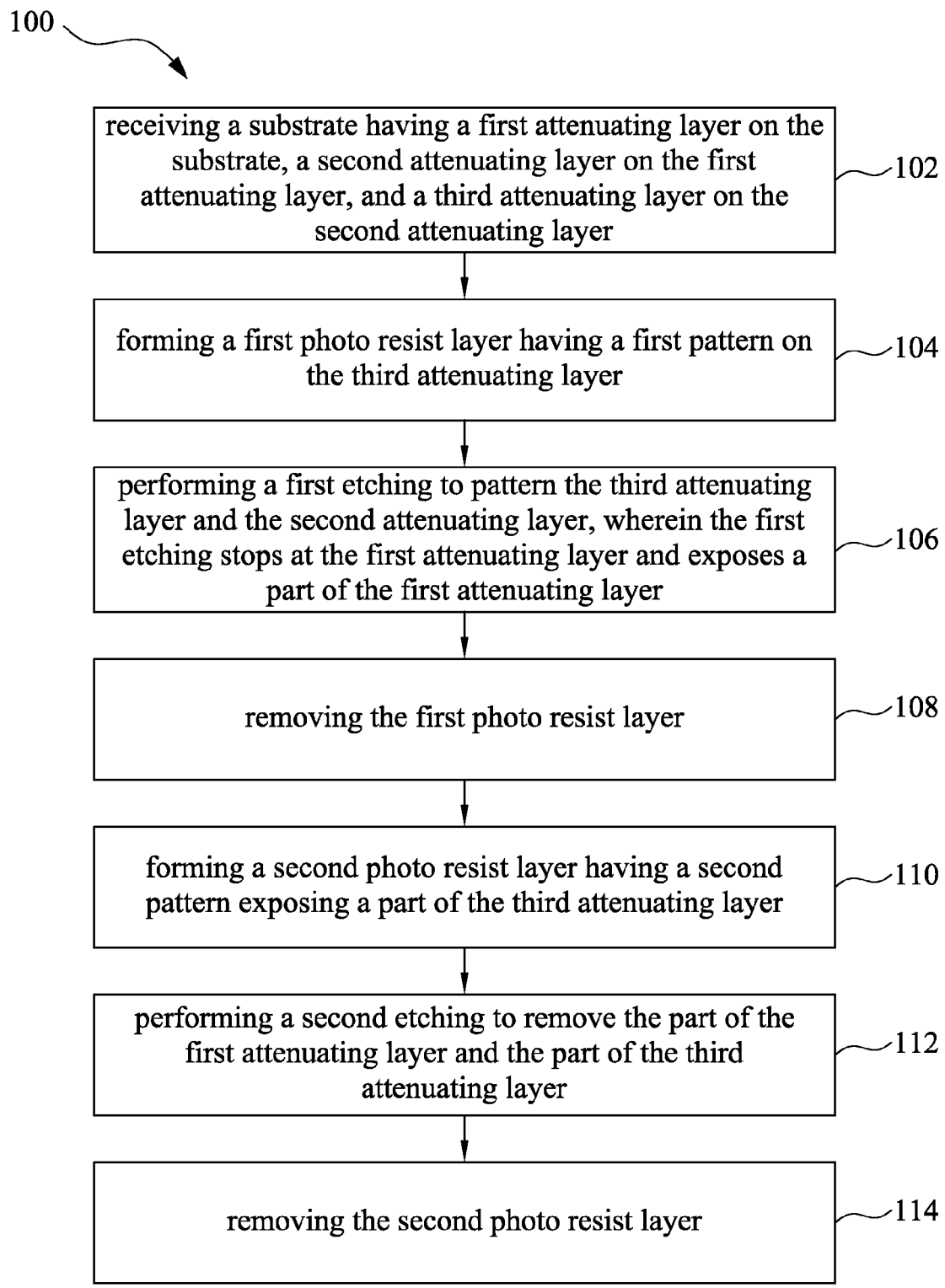
FIG. 1 is a flowchart illustrating a method of fabricating a reticle according to various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The singular forms "a," "an" and "the" used herein include plural referents unless the context clearly dictates otherwise. Therefore, reference to, for example, a liner layer includes embodiments having two or more such liner layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

As aforementioned, forming smaller CDs and fine patterns becomes even challenging so as to bring difficult requirements in lithography processes, and therefore reticles utilized in lithography processes become more delicate. However, costs in fabricating the reticles are accordingly increased. Beside, since various difficulties might occur in different scopes of application, a reticle utilized in lithography processes should also be more capable to overcome various difficulties so as to extend process margin in different scopes of application. In this regard, a reticle and a method of fabricating the reticle are provided according to various embodiments of the present disclosure.

FIG. 1 is a flowchart illustrating a method 100 of fabricating the reticle (also referred to as a mask or photomask) according to various embodiments of the present disclosure. The method 100 begins with block 102 in which a substrate is received. The substrate has a first attenuating layer on the substrate, a second attenuating layer on the first attenuating layer, and a third attenuating layer on the second attenuating layer. In various embodiments of the present disclosure, the substrate is transparent and includes quartz, silicon, silicon carbide, silicon oxide-titanium oxide alloy or combinations thereof. In various embodiments of the present disclosure, the first attenuating layer and the third attenuating layer include chromium. In various embodiments of the present disclosure, the first attenuating layer comprises chromium oxide, chromium nitride, chromium oxynitride, or combinations thereof. In various embodiments of the present disclosure, the second attenuating layer includes molybdenum silicide (MoSi). The method 100 continues with block 104 in which a first photo resist layer is formed. The first photo resist layer has a first pattern on the third attenuating layer. The method 100 also includes performing a first etching to pattern the third attenuating layer and the second attenuating layer, wherein the first etching stops at the first attenuating layer and exposes a part of the first attenuating layer as shown in block 106. The method 100 continues with block 108 in which the first photo resist layer is removed. The method 100 further includes forming a second photo resist layer having a second pattern exposing a part of the third attenuating layer as shown in block 110. The method 100 continues with block 112 in which a second etching is performed to remove the part of the first attenuating layer and the part of the third attenuating layer. The method 100 further includes removing the second photo resist layer as shown in block 114. The details of the methods 100 are further illustrated in FIGS. 2-15 and described in following paragraphs.

Figure 2:
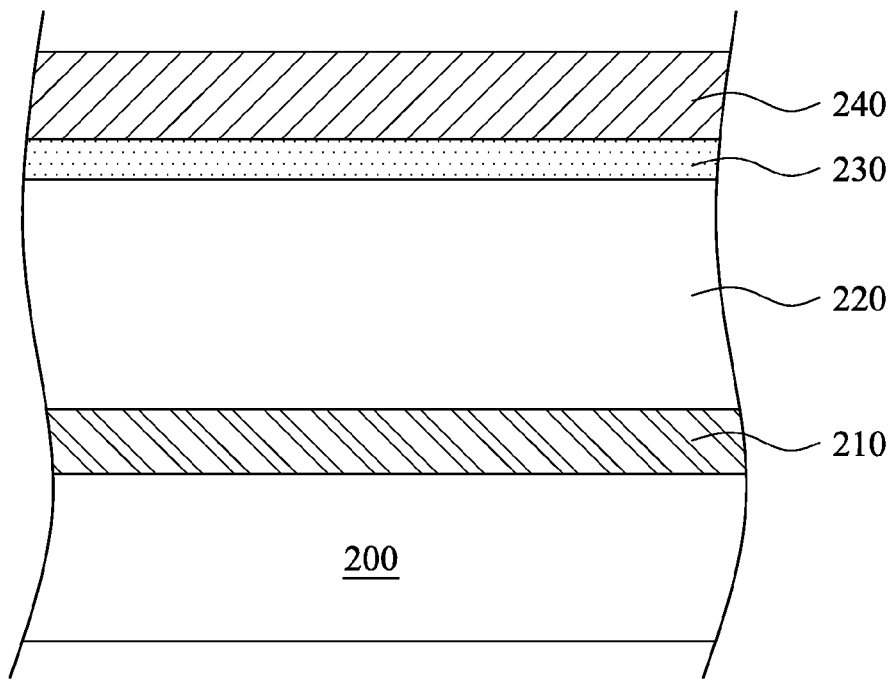
FIG. 2 is a schematic view of at least a portion of the substrate in an intermediate stage of the method of fabricating the reticle according to various embodiments of the present disclosure.
Figure 3:
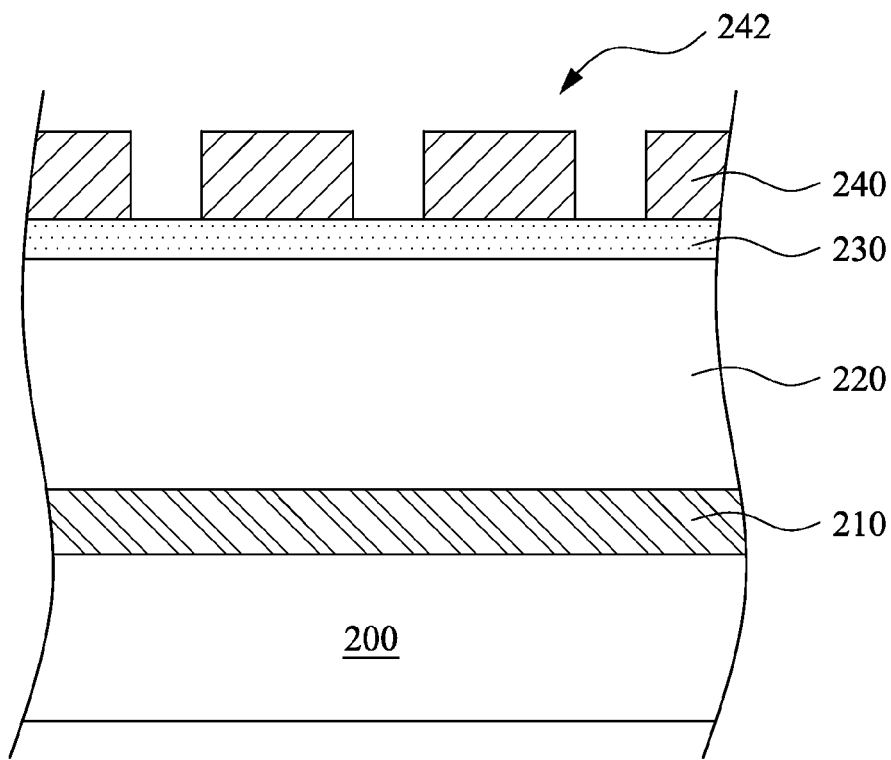
FIG. 3 is a schematic view of the substrate shown in FIG. 2 in a subsequent stage of the method of fabricating the reticle according to various embodiments of the present disclosure.

FIG. 2 is a schematic view of at least a portion of the substrate in an intermediate stage of the method of fabricating the reticle according to various embodiments of the present disclosure. FIG. 3 is a schematic view of the substrate shown in FIG. 2 in a subsequent stage of the method of fabricating the reticle according to various embodiments of the present disclosure. Referring to FIG. 2, a substrate 200 is received. The substrate 200 could be a light transmittable and a silicon-based substrate. In various embodiments of the present disclosure, the substrate 200 is transparent and comprises quartz, silicon, silicon carbide, silicon oxide-titanium oxide alloy or combinations thereof. The substrate 200 has a first attenuating layer 210, a second attenuating layer 220, and a third attenuating layer 230 on the substrate 200. The first attenuating layer 210 is disposed on the substrate 200. The second attenuating layer 220 is disposed on the first attenuating layer 210. The third attenuating layer 230 is disposed on the second attenuating layer 220. The first attenuating layer 210, the second attenuating layer 220, and the third attenuating layer 230 could be subsequently formed by chemical vapor deposition (CVD), physical vapor deposition (PVD), atomic layer deposition (ALD), and/or other suitable processes. The first attenuating layer 210 disposed on the substrate 200 is predetermined to provide a phase shift to a radiation beam employed in a lithography process. The first attenuating layer 210 could have a thickness such that the radiation beam directed toward and through the first attenuating layer 120 has a phase shift relative to the radiation beam directed through air. The radiation beam may be ultraviolet and/or can be extended to include other radiation beams such as ion beam, x-ray, extreme ultraviolet (EUV), deep ultraviolet (DUV), and other proper radiation energy. The first attenuating layer 210 could have a transmission less than 100% and more than 0%.

The second attenuating layer 220 is disposed on the first attenuating layer 210 and is also predetermined to provide a phase shift to a radiation beam employed in a lithography process. The second attenuating layer 220 could have a thickness such that the radiation beam directed toward and through the second attenuating layer 220 has a phase shift relative to the radiation beam directed through air. The radiation beam may be ultraviolet and/or can be extended to include other radiation beams such as ion beam, x-ray, extreme ultraviolet (EUV), deep ultraviolet (DUV), and other proper radiation energy. For example, the second attenuating layer 220 could provide a phase shift of about 180 degrees, and the second attenuating layer 220 could have a thickness about $\lambda/[2(n-1)]$, wherein $\lambda$ is the wavelength of the radiation beam projected on the mask 100 during a photolithography process for wafer fabrication, and n is refractive index of the first attenuating layer 220 relative to the radiation beam. For another example, the second attenuating layer 220 could provide a phase shift ranging between about 120 degrees and 240 degrees, and therefore the second attenuating layer 220 may have a thickness ranging between $\lambda/[3\times(n-1)]$ and $2\lambda/[3\times(n-1)]$ to realize a desired phase shift in the above range. The second attenuating layer 220 could have a transmission less than 100% and more than 0%. For example, the second attenuating layer 220 could have a transmission higher than about 5%. In various embodiments of the present disclosure, the second attenuating layer 220 comprises molybdenum silicide (MoSi). The third attenuating layer 230 is designed as an absorption layer and is opaque to the radiation beam used for lithography processing. The third attenuating layer 230 has a transmission less than that of the second attenuating layer 220. For example, the third attenuating layer 230 could have a substantially zero transmission. The third attenuating layer 230 could utilize a material different from that of the second attenuating layer 120. In various embodiments of the present disclosure, the first attenuating layer 210 and the third attenuating layer 230 includes chromium (Cr). Also as illustrated in FIG. 2, a first photo resist layer 240 is formed on the third attenuating layer 230. The first photo resist layer 240 could be formed on the substrate 201 by a suitable process such as spin coating process. For example, a soft baking and chilling process could be implemented after the first photo resist layer 240 is formed on the third attenuating layer 230. The first photo resist layer 240, for example, could be poly (4-t-butoxycarbonyloxystyrene), polymethylmethacrylate (PMMA), tetrafluoroethylene (TFE), or other suitable photoresist materials.

It should be noticed that the first attenuating layer 210 disposed on the substrate 200 also plays an important role as a stop layer of a following etching process, and therefore the substrate 200 could be well protected during the following etching process. Therefore, materials and film thicknesses of the first attenuating layer 210, the second attenuating layer 220, and the third attenuating layer 230 could be properly selected. For example, the second attenuating layer 220 is a material which would be etched simultaneously with the substrate 200. The substrate 200 could be quartz, silicon, silicon carbide, silicon oxide-titanium oxide alloy or combinations thereof, and the second attenuating layer 220 could be molybdenum silicide (MoSi), which also contains silica. On the other hand, the first attenuating layer 210 is a material which would not be etched while the second attenuating layer 220 and the substrate 200 are etched simultaneously. For example, the first attenuating layer 210 could be metals, metals oxides, metal nitrides, metal oxynitrides, or combinations thereof, which are totally different form materials of the second attenuating layer 220 and the substrate 200. In various embodiments of the present disclosure, the first attenuating layer 210 could be chromium oxide, chromium nitride, chromium oxynitride, or combinations thereof.

Referring to FIG. 3, the first photo resist layer 240 is patterned to have a first pattern 242 on the third attenuating layer 230. For example, a litho-etching process is performed such that the first photo resist layer 240 has the first pattern 242 as a hard mask of the film lamination (the first attenuating layer 210, the second attenuating layer 220, and the third attenuating layer 230) for following etching process.

Figure 4:
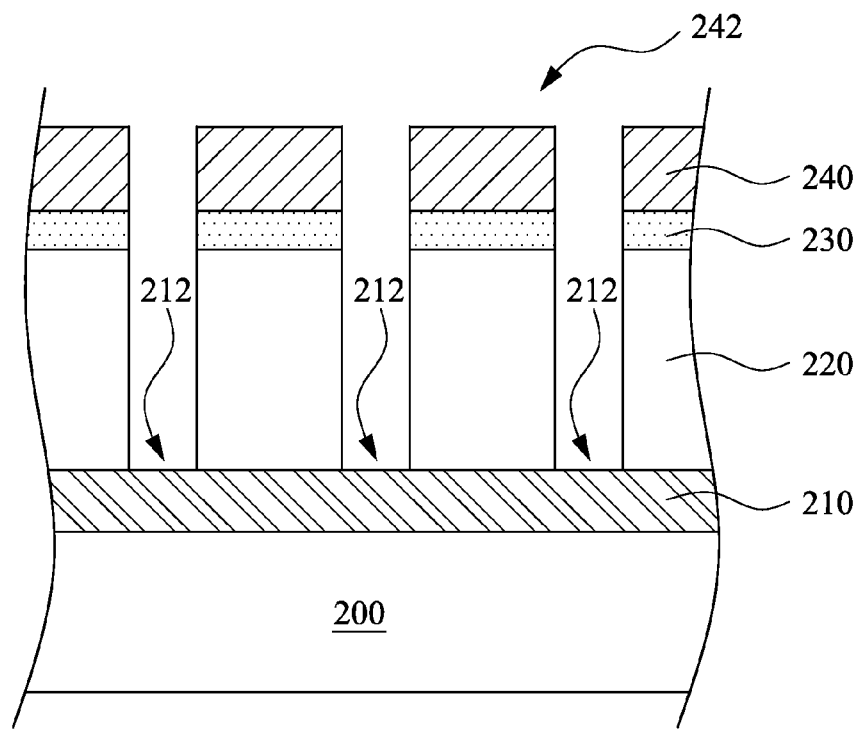
FIG. 4 is a schematic view of the substrate shown in FIG. 3 in a subsequent stage of the method of fabricating the reticle according to various embodiments of the present disclosure.
Figure 5:
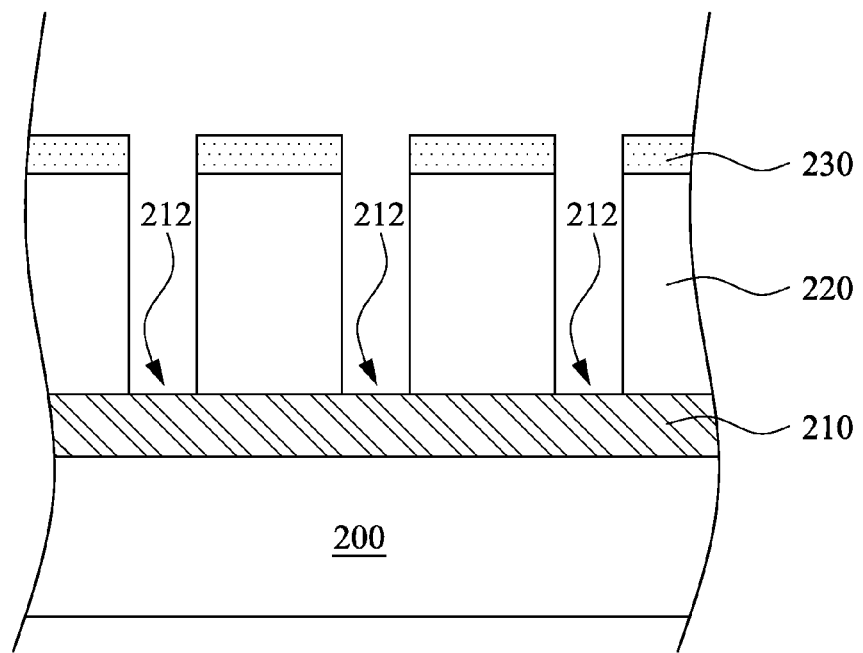
FIG. 5 is a schematic view of the substrate shown in FIG. 4 in a subsequent stage of the method of fabricating the reticle according to various embodiments of the present disclosure.

FIG. 4 is a schematic view of the substrate shown in FIG. 3 in a subsequent stage of the method of fabricating the reticle according to various embodiments of the present disclosure. FIG. 5 is a schematic view of the substrate shown in FIG. 4 in a subsequent stage of the method of fabricating the reticle according to various embodiments of the present disclosure. Referring to FIG. 4, a first etching is performed to pattern the third attenuating layer 230 and the second attenuating layer 220. The first etching could be wet etching, dry etching, or a combination thereof. As aforementioned, the first photo resist layer 240 having the first pattern 242 is the hard mask of the film lamination during the first etching process, and therefore the third attenuating layer 230 and the second attenuating layer 220 are etched to yield a pattern which is corresponding to the first pattern 242. It should be noticed that the first etching stops at the first attenuating layer 210 and exposes a part 212 of the first attenuating layer 210. In other words, the first attenuating layer 210 is a stop layer of the first etching. Therefore, materials and film thicknesses of the first attenuating layer 210, the second attenuating layer 220, and the third attenuating layer 230 could be properly selected. In various embodiments of the present disclosure, a film thickness of the first attenuating layer 210 is ranging from about 3 nm to about 80 nm, and a film thickness of the third attenuating layer 230 is ranging from about 3 nm to about 50 nm. In various embodiments of the present disclosure, a film thickness of the second attenuating layer 220 is ranging from about 20 nm to about 100 nm. In addition, parameters of the first etching such as etchants, etching time, plasma intensities (in dry etching) could also be optimized and lead the first etching to stop at the first attenuating layer 210. As illustrated in FIG. 4 and FIG. 5, after the first etching is performed to pattern the third attenuating layer 230 and the second attenuating layer 220, the first photo resist layer 240 having the first pattern 242 is removed. Therefore, the film lamination (the first attenuating layer 210, the second attenuating layer 220, and the third attenuating layer 230) is patterned as shown in FIG. 5.

Figure 6:
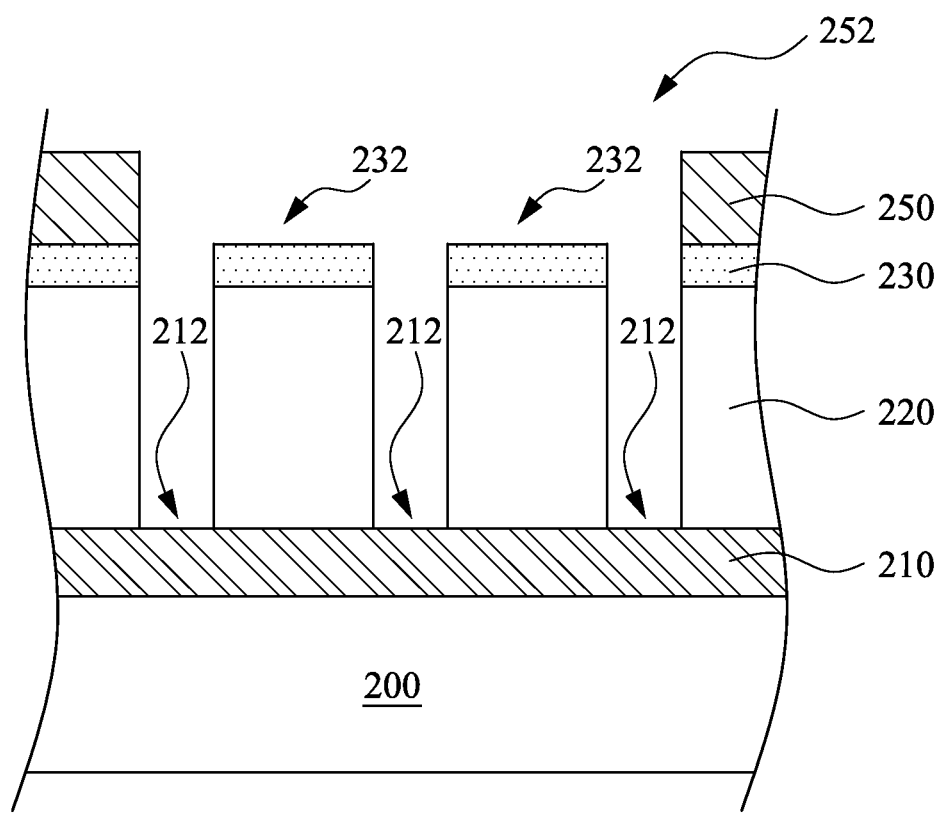
FIG. 6 is a schematic view of the substrate shown in FIG. 5 in a subsequent stage of the method of fabricating the reticle according to various embodiments of the present disclosure.

FIG. 6 is a schematic view of the substrate shown in FIG. 5 in a subsequent stage of the method of fabricating the reticle according to various embodiments of the present disclosure. Referring to FIG. 6, a second photo resist layer 250 having a second pattern 252 exposing a part 232 of the third attenuating layer 230. The second photo resist layer 250 could be formed on the film lamination (the first attenuating layer 210, the second attenuating layer 220, and the third attenuating layer 230) shown in FIG. 5 by a suitable process such as spin coating process. For example, a soft baking and chilling process could be implemented after the second photo resist layer 250 is formed on the film lamination shown in FIG. 5. The second photo resist layer 250, for example, could be poly (4-t-butoxycarbonyloxystyrene), polymethylmethacrylate (PMMA), tetrafluoroethylene (TFE), or other suitable photoresist materials. As illustrated in FIG. 6, the second photo resist layer 250 is patterned to have a second pattern 252 on the third attenuating layer 230. For example, a litho-etching process is performed such that the second photo resist layer 250 has the second pattern 252 as a hard mask of the film lamination as shown in FIG. 5 for following etching process.

Figure 7:
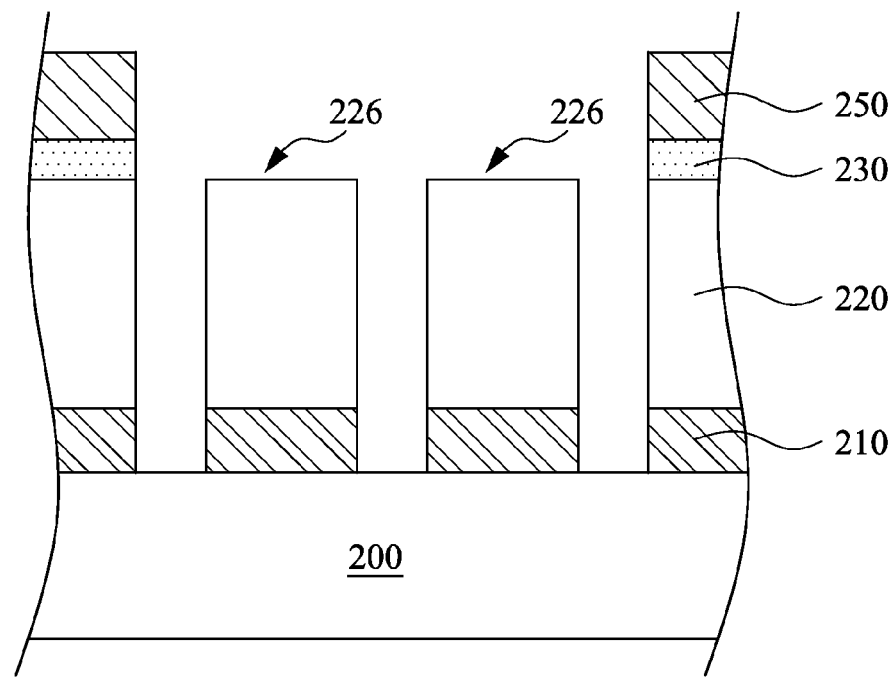
FIG. 7 is a schematic view of the substrate shown in FIG. 6 in a subsequent stage of the method of fabricating the reticle according to various embodiments of the present disclosure.
Figure 8:
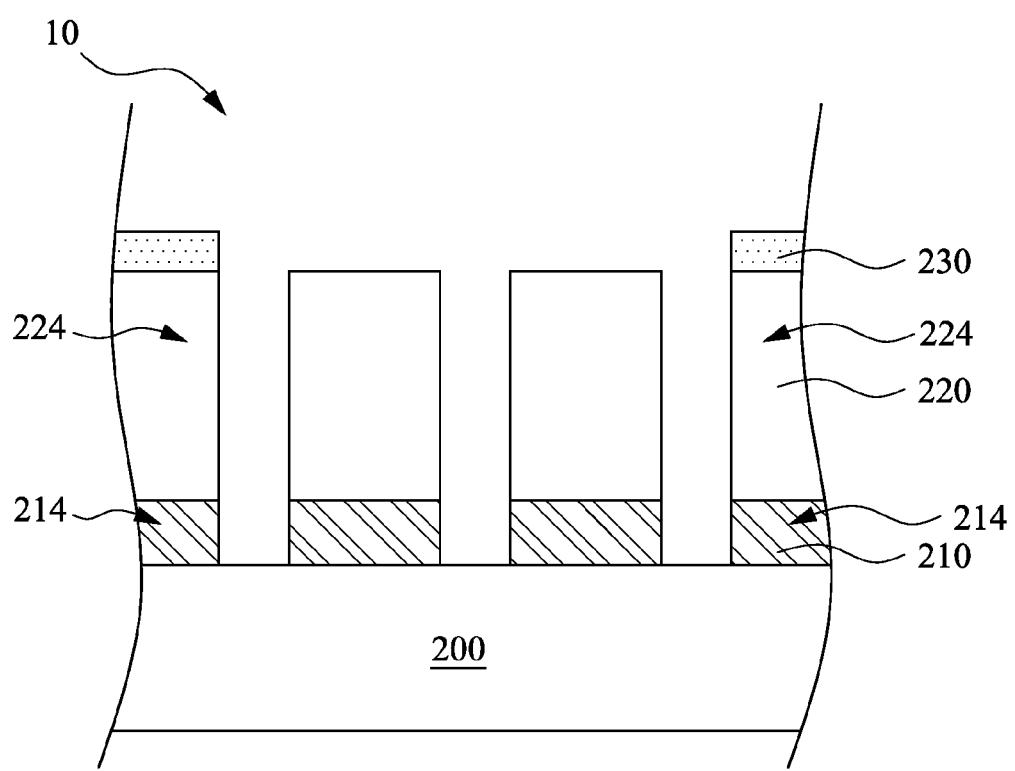
FIG. 8 is a schematic view of the substrate shown in FIG. 7 in a subsequent stage of the method of fabricating the reticle according to various embodiments of the present disclosure.

FIG. 7 is a schematic view of the substrate shown in FIG. 6 in a subsequent stage of the method of fabricating the reticle according to various embodiments of the present disclosure. FIG. 8 is a schematic view of the substrate shown in FIG. 7 in a subsequent stage of the method of fabricating the reticle according to various embodiments of the present disclosure. Referring to FIG. 7 and FIG. 8, a second etching is performed to remove the part 212 of the first attenuating layer 210 and the part 232 of the third attenuating layer 230. The second etching could be wet etching, dry etching, or a combination thereof. As aforementioned, the second photo resist layer 250 having the second pattern 252 is the hard mask of the film lamination during the second etching process, and therefore the part 212 of the first attenuating layer 210 and the part 232 of the third attenuating layer 230 are etched and removed. As illustrated in FIG. 7 and FIG. 8, after the second etching is performed to remove the part 212 of the first attenuating layer 210 and the part 232 of the third attenuating layer 230, the second photo resist layer 250 having the second pattern 252 is removed. Therefore, the film lamination (the first attenuating layer 210, the second attenuating layer 220, and the third attenuating layer 230) is patterned and a reticle 10 is fabricated as shown in FIG. 8. As illustrated in FIG. 8, the reticle 10 includes a substrate 200, a patterned first attenuating layer 210, a patterned second attenuating layer 220, and a patterned third attenuating layer 230. The patterned first attenuating layer 210 is disposed on the substrate 200. The patterned second attenuating layer 220 is disposed on the patterned first attenuating layer 210. The patterned third attenuating layer 230 is disposed on the patterned second attenuating layer 220. It should be noticed that a first part 214 of the patterned first attenuating layer 210, a first part 224 of patterned second attenuating layer 220, and the patterned third attenuating layer 230 are stacked on the substrate 220 as a binary intensity mask portion. The binary intensity mask portion includes a reflective region and an opaque region. In the reflective region, the incident light is reflected by a multilayer formed by the first part 214 of the patterned first attenuating layer 210, the first part 224 of patterned second attenuating layer 220, and the patterned third attenuating layer 230 on the substrate 220 in FIG. 8. In the opaque region, the substrate 220 is an absorber and an incident light beam is almost fully absorbed by the absorber.

Figure 9:
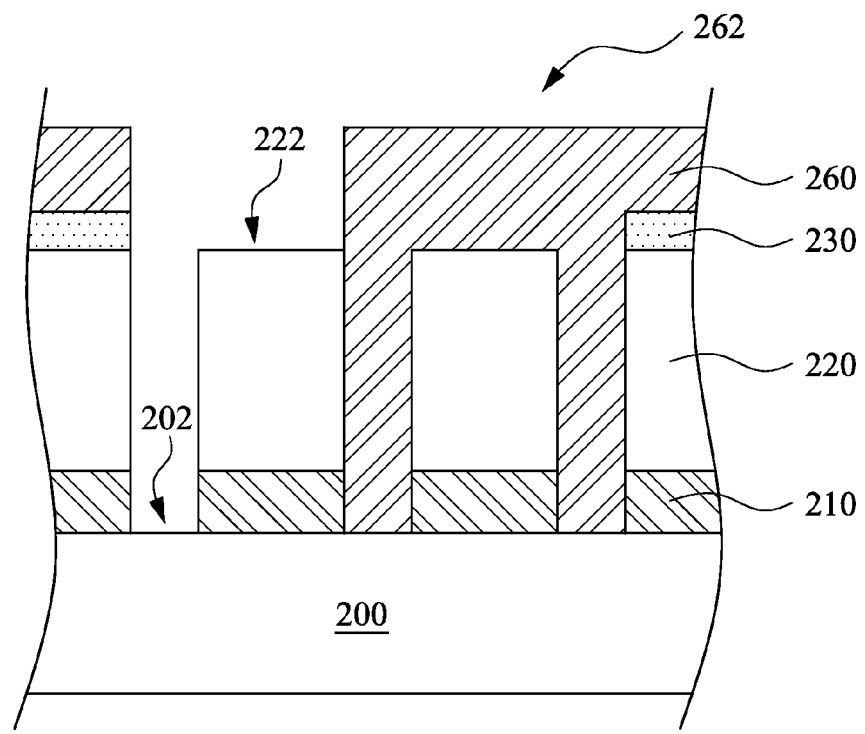
FIG. 9 is a schematic view of the substrate shown in FIG. 8 in a subsequent stage of the method of fabricating the reticle according to various embodiments of the present disclosure.

FIG. 9 is a schematic view of the substrate shown in FIG. 8 in a subsequent stage of the method of fabricating the reticle according to various embodiments of the present disclosure. Referring to FIG. 9, in various embodiments of the present disclosure, a third photo resist layer 260 is formed after the operation of removing the second photo resist layer 250. The third photo resist layer 260 has a third pattern 262 exposing a part 222 of the second attenuating layer 220 and a part 202 of the substrate 200. The third photo resist layer 260 could be formed on the film lamination (the first attenuating layer 210, the second attenuating layer 220, and the third attenuating layer 230) shown in FIG. 8 by a suitable process such as spin coating process. For example, a soft baking and chilling process could be implemented after the third photo resist layer 260 is formed on the film lamination shown in FIG. 8. The third photo resist layer 260, for example, could be poly (4-t-butoxycarbonyloxystyrene), polymethylmethacrylate (PMMA), tetrafluoroethylene (TFE), or other suitable photoresist materials. As illustrated in FIG. 9, the third photo resist layer 260 is patterned to have a third pattern 262. For example, a litho-etching process is performed such that the third photo resist layer 260 has the third pattern 262 as a hard mask of the film lamination as shown in FIG. 8 for following etching process.

Figure 10:
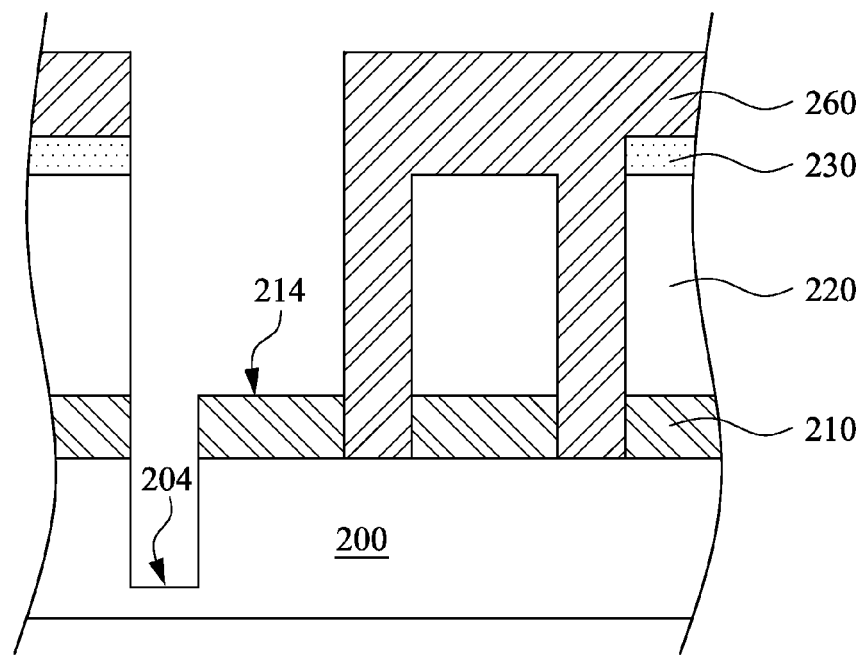
FIG. 10 is a schematic view of the substrate shown in FIG. 9 in a subsequent stage of the method of fabricating the reticle according to various embodiments of the present disclosure.

FIG. 10 is a schematic view of the substrate shown in FIG. 9 in a subsequent stage of the method of fabricating the reticle according to various embodiments of the present disclosure. Referring to FIG. 10, after the operation of forming the third photo resist layer 260 having the third pattern 262 exposing the part 222 of the second attenuating layer 220 and the part 202 of the substrate 200, a third etching is performed to remove the part 222 of the second attenuating layer 220 and the part 202 of the substrate 202. As illustrated in FIG. 10, a part 214 of the first attenuating layer 210 is exposed when the part 222 of the second attenuating layer 220 (as shown in FIG. 8) is removed, and a trench 204 of the substrate 200 is formed. The third etching could be wet etching, dry etching, or a combination thereof. As aforementioned, the third photo resist layer 260 having the third pattern 262 is the hard mask of the film lamination during the first etching process, and therefore the part 222 of the second attenuating layer 220 and the part 202 of the substrate 200 are etched to yield a pattern which is corresponding to the first pattern 242. It should be noticed that the third etching etches both of the exposed parts of the second attenuating layer 220 and the substrate 202. As aforementioned, materials of the second attenuating layer 220 and the substrate 202 could be well selected to make it possible to etch both kinds of layers (the second attenuating layer 220 and the substrate 200) simultaneously. In various embodiments of the present disclosure, the substrate 200 includes quartz, silicon, silicon carbide, silicon oxide-titanium oxide alloy or combinations thereof. In various embodiments of the present disclosure, the second attenuating layer 220 includes molybdenum silicide (MoSi). In addition, parameters of the first etching such as etchants, etching time, plasma intensities (in dry etching) could also be optimized corresponding to materials selected for the second attenuating layer 220 and the substrate 200. As illustrated in FIG. 9 and FIG. 10, after the third etching is performed remove the part 222 of the second attenuating layer 220 and the part 202 of the substrate 200, the part 214 of the first attenuating layer 210 is exposed. Therefore, the film lamination (the first attenuating layer 210, the second attenuating layer 220, and the third attenuating layer 230) is patterned as shown in FIG. 10.

Figure 11:
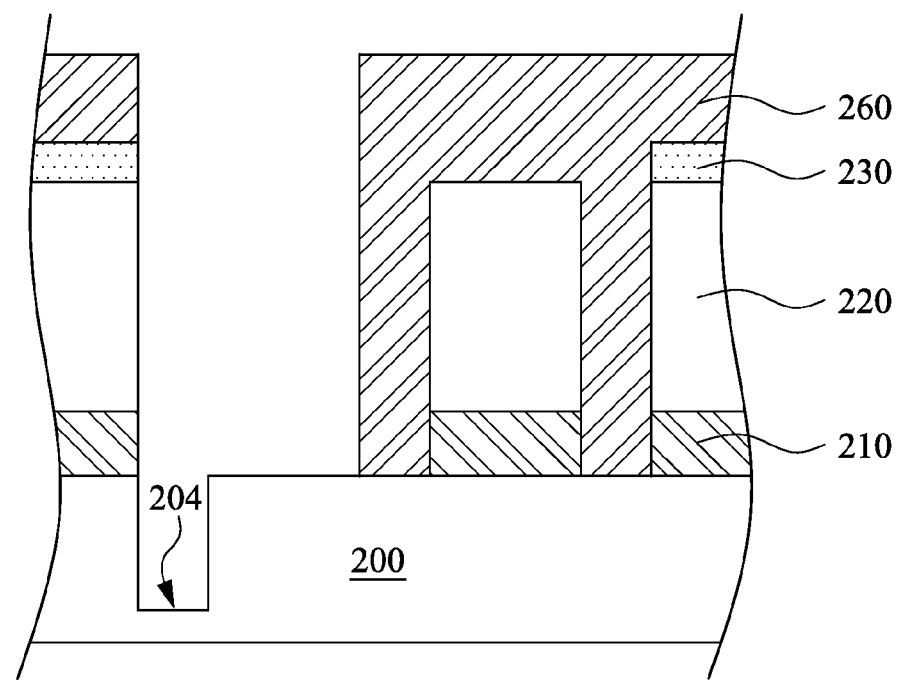
FIG. 11 is a schematic view of the substrate shown in FIG. 10 in a subsequent stage of the method of fabricating the reticle according to various embodiments of the present disclosure.
Figure 12:
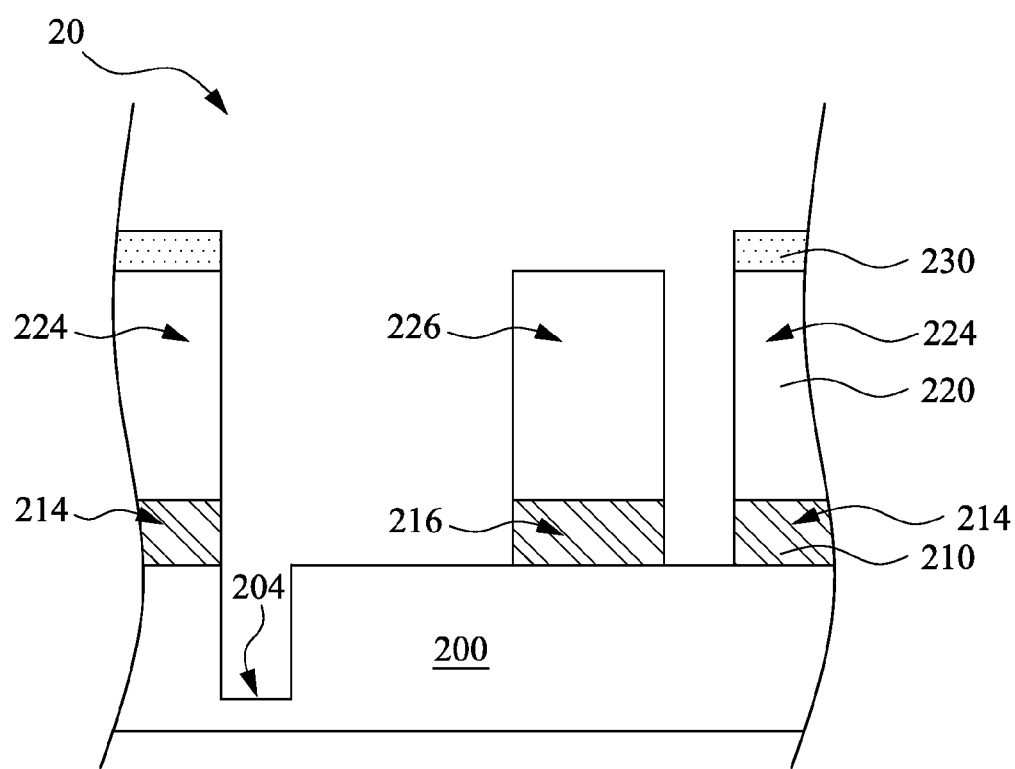
FIG. 12 is a schematic view of the substrate shown in FIG. 11 in a subsequent stage of the method of fabricating the reticle according to various embodiments of the present disclosure.

FIG. 11 is a schematic view of the substrate shown in FIG. 10 in a subsequent stage of the method of fabricating the reticle according to various embodiments of the present disclosure. FIG. 12 is a schematic view of the substrate shown in FIG. 11 in a subsequent stage of the method of fabricating the reticle according to various embodiments of the present disclosure. Referring to FIG. 10 and FIG. 11, the exposed part 214 of the first attenuating layer 210 is removed after the operation of performing the third etching to remove the part 222 of the second attenuating layer 220 and the part 202 of the substrate 204. The exposed part 214 of the first attenuating layer 210 could be removed by wet etching, dry etching, or a combination thereof. Accordingly, another reticle 20 is fabricated as shown in FIG. 12. As illustrated in FIG. 12, the reticle 20 includes a substrate 200, a patterned first attenuating layer 210, a patterned second attenuating layer 220, and a patterned third attenuating layer 230. The patterned first attenuating layer 210 is disposed on the substrate 200. The patterned second attenuating layer 220 is disposed on the patterned first attenuating layer 210. The patterned third attenuating layer 230 is disposed on the patterned second attenuating layer 220. The first part 214 of the patterned first attenuating layer 210, the first part 224 of patterned second attenuating layer 220, and the patterned third attenuating layer 230 are stacked on the substrate 220 as a binary intensity mask portion. The binary intensity mask portion includes a reflective region and an opaque region. In the reflective region, the incident light is reflected by a multilayer formed by the first part 214 of the patterned first attenuating layer 210, the first part 224 of patterned second attenuating layer 220, and the patterned third attenuating layer 230 on the substrate 220 in FIG. 8. In the opaque region, the substrate 220 is an absorber and an incident light beam is almost fully absorbed by the absorber. In addition, the substrate 200 has at least one trench 204, which is not covering by the patterned first attenuating layer 210. It should be noticed that the trench 204 in the substrate 200 could act as a chromeless phase shift mask portion in the reticle 20. The chromeless phase shift mask does not have opaque parts. The phase shift is achieved by trench 204 which is directly etched into the substrate 200. Therefore, a depth of the trench 204 has to be controlled carefully. For example, the trench 204 formed in the substrate 200 could have a phase shift about 180 degrees, and the trench 204 could have a depth about $\lambda/[2(n-1)]$, wherein $\lambda$ is the wavelength of the radiation beam implemented to the trench 204, and n is refractive index of the transparent substrate 200 relative to the radiation beam. For another example, the trench 204 in the substrate 200 could have a phase shift ranging between about 120 degrees and 240 degrees, and the trench 204 could have a depth ranging between $\lambda/[3\times(n-1)]$ and $2\lambda/[3\times(n-1)]$ to realize a phase shift in the desired range. The manufacturing of chromeless phase shift masks is difficult since the substrate 200 could be damaged during a series of etching process. As aforementioned from FIG. 4 to FIG. 6, the substrate 200 is covered by the first attenuating layer 210 without being exposed. Therefore, damages to the substrate 200 could be reduced, and the depth of the trench 204 could be controlled precisely according to various embodiments of the present disclosure. As aforementioned, since the depth of the trench 204 could to be controlled precisely, the chromeless phase shift mask portion of the reticle 20 could be fabricated corresponding to various requirements on phase shifting. As illustrated in FIG. 12, it should also be noticed that a second part 216 of the patterned first attenuating layer 210, a second part 226 of patterned second attenuating layer 220 are stacked on the substrate 200 as an attenuated phase shift mask (APSM) portion. The APSM uses a patterned layer of molybdenum silicide (MoSi) which represents the structures of the circuit. The molybdenum silicide has a thickness which causes a phase shift of the transmitted light of 180°. Thus the phase shifted light and the radiation which transmits through glass only interfere destructively. In addition the molybdenum silicide is dense. On the one hand the light is attenuated and on the other hand the light waves which are in opposite phase erase each other almost completely, this results in a higher contrast.

Figure 13:
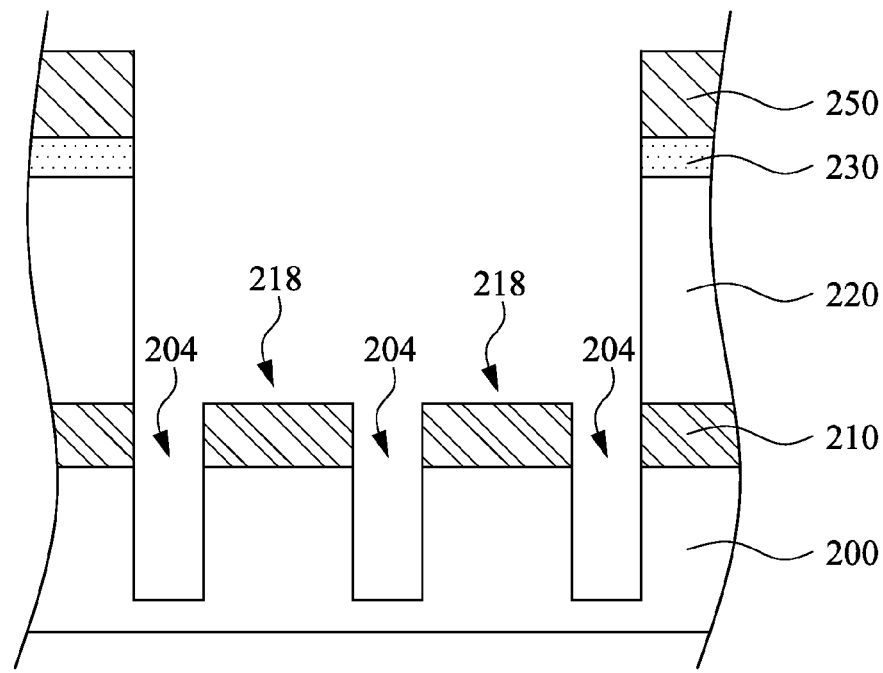
FIG. 13 is a schematic view of the substrate shown in FIG. 7 in a subsequent stage of the method of fabricating the reticle according to other various embodiments of the present disclosure.
Figure 14:
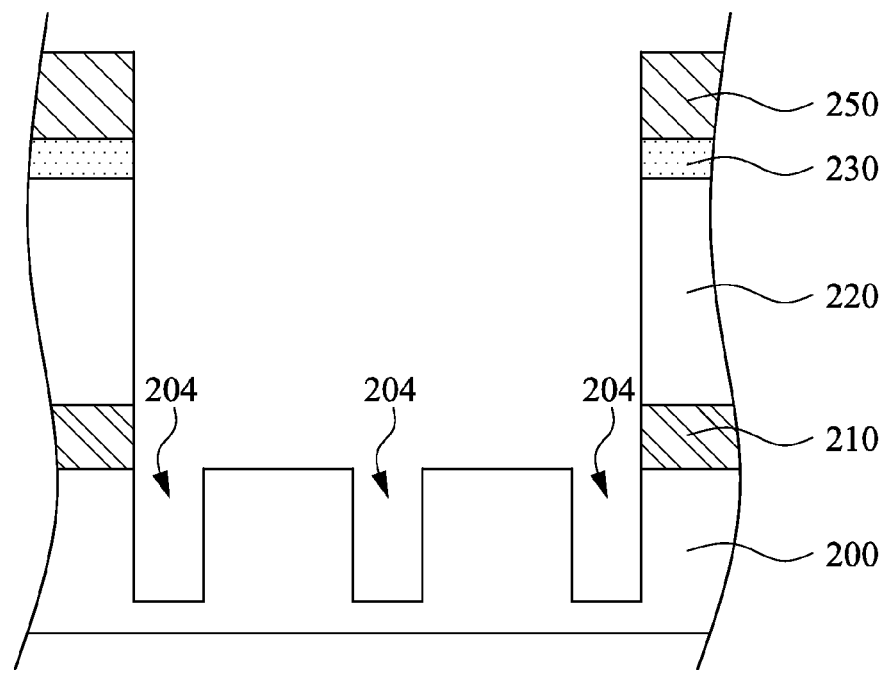
FIG. 14 is a schematic view of the substrate shown in FIG. 13 in a subsequent stage of the method of fabricating the reticle according to other various embodiments of the present disclosure.
Figure 15:
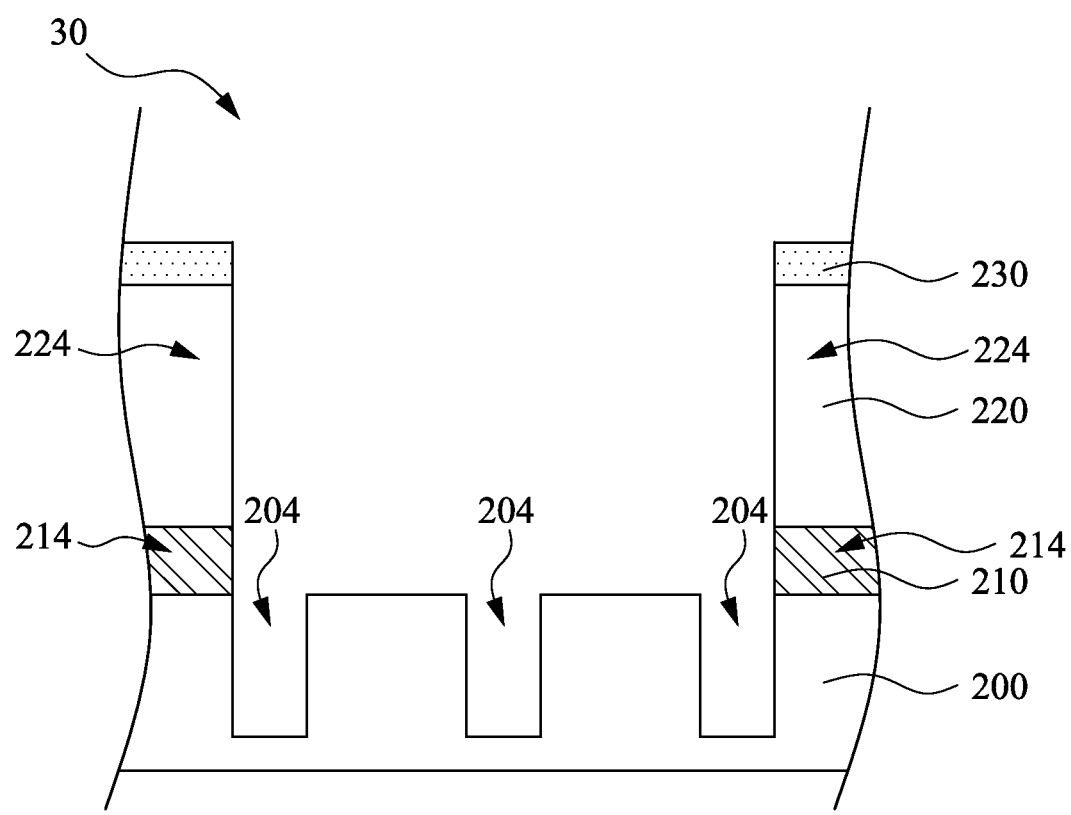
FIG. 15 is a schematic view of the substrate shown in FIG. 14 in a subsequent stage of the method of fabricating the reticle according to other various embodiments of the present disclosure.

FIG. 13 is a schematic view of the substrate shown in FIG. 7 in a subsequent stage of the method of fabricating the reticle according to other various embodiments of the present disclosure. FIG. 14 is a schematic view of the substrate shown in FIG. 13 in a subsequent stage of the method of fabricating the reticle according to other various embodiments of the present disclosure. FIG. 15 is a schematic view of the substrate shown in FIG. 14 in a subsequent stage of the method of fabricating the reticle according to other various embodiments of the present disclosure. Referring to FIG. 13, in other various embodiments of the present disclosure, before removing the second photo resist layer (as illustrated in FIG. 7 and FIG. 8), a third etching is performed to remove a part 226 of the second attenuating layer 220 and form a trench 204 on the substrate 200. The third etching could be wet etching, dry etching, or a combination thereof. The second photo resist layer 250 having the second pattern 242 is also the hard mask of the film lamination during the third etching process, and therefore the part 226 of the second attenuating layer 220 is removed and the substrate 200 are etched to the trench 204. It should be noticed that the third etching also stops at the first attenuating layer 210 and exposes another part 218 of the first attenuating layer 210. In other words, the first attenuating layer 210 also is a stop layer of the third etching. Therefore, materials and film thicknesses of the first attenuating layer 210, the second attenuating layer 220, and the third attenuating layer 230 could be properly selected. For example, the second attenuating layer 220 is a material which would be etched simultaneously with the substrate 200. The substrate 200 could be quartz, silicon, silicon carbide, silicon oxide-titanium oxide alloy or combinations thereof, and the second attenuating layer 220 could be molybdenum silicide (MoSi), which also contains silica. On the other hand, the first attenuating layer 210 is a material which would not be etched while the second attenuating layer 220 and the substrate 200 are etched simultaneously. For example, the first attenuating layer 210 could be metals, metals oxides, metal nitrides, metal oxynitrides, or combinations thereof, which are totally different form materials of the second attenuating layer 220 and the substrate 200. In various embodiments of the present disclosure, the first attenuating layer 210 could be chromium oxide, chromium nitride, chromium oxynitride, or combinations thereof. Referring to FIG. 14, after the operation of performing the third etching, the another part 218 of the first attenuating layer 210 is removed. As aforementioned, the first attenuating layer 210 could be metals, metals oxides, metal nitrides, metal oxynitrides, or combinations thereof, which are totally different form materials of the second attenuating layer 220 and the substrate 200. The another part 218 of the first attenuating layer 210 could be removed by wet etching, dry etching, or a combination thereof without damaging the second attenuating layer 220 and the substrate 200. Therefore, a depth of the trench 204 could to be controlled carefully. Referring to FIG. 15, after the operation of removing the another part 218 of the first attenuating layer 210, the second photo resist layer 230 is removed. The second photo resist layer 230 could be removed by wet etching, dry etching, or a combination thereof. Accordingly, another reticle 30 is fabricated as shown in FIG. 15. As illustrated in FIG. 15, the reticle 30 includes a substrate 200, a patterned first attenuating layer 210, a patterned second attenuating layer 220, and a patterned third attenuating layer 230. The patterned first attenuating layer 210 is disposed on the substrate 200. The patterned second attenuating layer 220 is disposed on the patterned first attenuating layer 210. The patterned third attenuating layer 230 is disposed on the patterned second attenuating layer 220. The first part 214 of the patterned first attenuating layer 210, the first part 224 of patterned second attenuating layer 220, and the patterned third attenuating layer 230 are stacked on the substrate 220 as a binary intensity mask portion. The binary portion of the reticle 30 is similar to that of the reticle 20, and therefore the details are omitted here. Referring to FIG. 15, it should be noticed that the substrate 200 has at least one trench 204, which is not covering by the patterned first attenuating layer 210. Therefore, the trench 204 in the substrate 200 could act as a chromeless phase shift mask portion in the reticle 30. The chromeless phase shift mask portion of the reticle 30 is also similar to that of the reticle 20, and therefore the details are omitted here. As aforementioned, since the depth of the trench 204 could to be controlled carefully, the chromeless phase shift mask portion of the reticle 30 could be fabricated corresponding to various requirements on phase shifting.

As aforementioned, reticles utilized in lithography processes become more delicate so that costs in fabricating the reticles are accordingly increased. According to various embodiments of the present disclosure, methods of fabricating a reticle provide an effective way to form various portions on one substrate. The reticle having various film stacks on one substrate provides various portions for different scopes of application, and therefore is more capable to overcome various difficulties so as to extend process margin in different scopes of application. In addition, the depth of the trench could to be well controlled, and therefore the chromeless phase shift mask portion of the reticles according to various embodiments of the present disclosure could be fabricated corresponding to various requirements on phase shifting.

According to various embodiments of the present disclosure, a method of fabricating the reticle includes receiving a substrate having a first attenuating layer on the substrate, a second attenuating layer on the first attenuating layer, and a third attenuating layer on the second attenuating layer. The method further includes forming a first photo resist layer having a first pattern on the third attenuating layer. The method further includes performing a first etching to pattern the third attenuating layer and the second attenuating layer. The first etching stops at the first attenuating layer and exposes a part of the first attenuating layer. The method further includes removing the first photo resist layer. The method further includes forming a second photo resist layer having a second pattern exposing a part of the third attenuating layer. The method further includes performing a second etching to remove the part of the first attenuating layer and the part of the third attenuating layer. The method further includes removing the second photo resist layer.

According to other various embodiments of the present disclosure, the reticle includes a substrate, a patterned first attenuating layer, a patterned second attenuating layer, and a patterned third attenuating layer. The patterned first attenuating layer is disposed on the substrate. The patterned second attenuating layer is disposed on the patterned first attenuating layer. The patterned third attenuating layer is disposed on the patterned second attenuating layer. A first part of the patterned first attenuating layer, a first part of patterned second attenuating layer, and the patterned third attenuating layer are stacked on the substrate as a binary intensity mask portion. A second part of the patterned first attenuating layer, and a second part of patterned second attenuating layer are stacked on the substrate as an attenuated phase shift mask portion.

According to other various embodiments of the present disclosure, the reticle includes a substrate, a patterned first attenuating layer, a patterned second attenuating layer, and a patterned third attenuating layer. The patterned first attenuating layer is disposed on the substrate. The patterned second attenuating layer is disposed on the patterned first attenuating layer. The patterned third attenuating layer is disposed on the patterned second attenuating layer. A first part of the patterned first attenuating layer, a first part of patterned second attenuating layer, and the patterned third attenuating layer are stacked on the substrate as a binary intensity mask portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A reticle, comprising:
   a substrate;
   a patterned first attenuating layer disposed on the substrate;
   a patterned second attenuating layer disposed on the patterned first attenuating layer; and
   a patterned third attenuating layer disposed on the patterned second attenuating layer,
   wherein a first part of the patterned first attenuating layer, a first part of patterned second attenuating layer, and the patterned third attenuating layer are stacked on the substrate as a binary intensity mask portion.

2. The reticle of claim 1, wherein the substrate has at least one trench that is not covering by the patterned first attenuating layer.

3. The reticle of claim 2, wherein a second part of the patterned first attenuating layer and a second part of the patterned second attenuating layer are stacked on the substrate as an attenuated phase shift mask portion.

4. The reticle of claim 3, wherein the substrate is transparent and comprises quartz, silicon, silicon carbide, calcium fluoride, silicon oxide-titanium oxide alloy or combinations thereof.

5. The reticle of claim 1, wherein the patterned first attenuating layer and the patterned third attenuating layer comprise chromium.

6. The reticle of claim 1, wherein the patterned first attenuating layer comprises chromium oxide, chromium nitride, chromium oxynitride, or combinations thereof.

7. The reticle of claim 6, wherein a film thickness of the patterned first attenuating layer is ranging from about 3 nm to about 80 nm, and a film thickness of the patterned third attenuating layer is ranging from about 3 nm to about 50 nm.

8. The reticle of claim 1, wherein the patterned second attenuating layer comprises molybdenum silicide (MoSi).

9. The reticle of claim 2, wherein the trench has a depth ranging between $\lambda/[3\times(n-1)]$ and $2\lambda/[3\times(n-1)]$, where $\lambda$ is a wavelength of a radiation beam implemented to the trench, and n is refractive index of the substrate relative to the radiation beam.

10. The reticle of claim 8, wherein a film thickness of the patterned second attenuating layer ranges from about 20 nm to about 100 nm.

11. A reticle, comprising:
    a substrate;
    a patterned first attenuating layer disposed on the substrate;
    a patterned second attenuating layer disposed on the patterned first attenuating layer; and
    a patterned third attenuating layer disposed on the patterned second attenuating layer,
    wherein a first part of the patterned first attenuating layer, a first part of the patterned second attenuating layer, and the patterned third attenuating layer are stacked on the substrate as a binary intensity mask portion, and a second part of the patterned first attenuating layer and a second part of the patterned second attenuating layer are stacked on the substrate as an attenuated phase shift mask portion.

12. The reticle of claim 11, wherein the substrate has at least one trench, which is not covering by the patterned first attenuating layer.

13. The reticle of claim 11, wherein the substrate is transparent and comprises quartz, silicon, silicon carbide, calcium fluoride, silicon oxide-titanium oxide alloy or combinations thereof.

14. The reticle of claim 11, wherein the patterned first attenuating layer and the patterned third attenuating layer comprise chromium.

15. The reticle of claim 14, wherein the patterned first attenuating layer comprises chromium oxide, chromium nitride, chromium oxynitride, or combinations thereof.

16. The reticle of claim 15, wherein a film thickness of the patterned first attenuating layer ranges from about 3 nm to about 80 nm, and a film thickness of the patterned third attenuating layer ranges from about 3 nm to about 50 nm.

17. The reticle of claim 11, wherein the patterned second attenuating layer comprises molybdenum silicide (MoSi).

18. The reticle of claim 17, wherein a film thickness of the patterned second attenuating layer ranges from about 20 nm to about 100 nm.

19. The reticle of claim 11, wherein the substrate has at least one trench, which is not covering by the patterned first attenuating layer.

20. The reticle of claim 19, wherein the trench has a depth ranging between $\lambda/[3\times(n-1)]$ and $2\lambda/[3\times(n-1)]$, where $\lambda$ is a wavelength of a radiation beam implemented to the trench, and n is refractive index of the substrate relative to the radiation beam.

* * * * *